United States Patent [19]
Wolf

[11] Patent Number: 5,983,383
[45] Date of Patent: Nov. 9, 1999

[54] METHOD AND APPARATUS FOR TRANSMITTING AND RECEIVING CONCATENATED CODE DATA

[75] Inventor: Jack K. Wolf, La Jolla, Calif.

[73] Assignee: Qualcom Incorporated, San Diego, Calif.

[21] Appl. No.: 08/786,952

[22] Filed: Jan. 17, 1997

[51] Int. Cl.$^6$ .......................... H03M 13/00; H03M 13/12
[52] U.S. Cl. .......................... 714/755; 714/795; 714/796
[58] Field of Search .................................. 371/37.4, 38.1, 371/39.1, 41, 42, 37.11, 43.4, 44, 45, 46, 43.7, 43.8; 714/755, 795, 796, 774

[56] References Cited

U.S. PATENT DOCUMENTS

| | | | |
|---|---|---|---|
| 4,718,066 | 1/1988 | Rogard | 371/35 |
| 5,375,127 | 12/1994 | Leak et al. | 371/40.1 |
| 5,673,291 | 9/1997 | Dent | 375/262 |
| 5,710,783 | 1/1998 | Luthi et al. | 371/37.4 |

OTHER PUBLICATIONS

Paaske, "Improved Decoding for a Concatenated Coding System Recommended by CCSDS", IEEE Trans. on Communications, vol. 38, No. 8, Aug. 1990, pp. 1138–1144.

Paaske, "Alternative to NASA's Concatenated Coding System for the Galileo Mission", IEE Proc.–Commun., vol. 141, No. 4, Aug. 1994, pp. 229–232.

Dolinar et al., "Enhanced Decoding for the Galileo Low–Gain Antenna Mission", Dec. 1994 Int'l. Symposium on Information Theory, p. 344.

Aridhi et al., "Performance Analysis of Type–I and Type–II Hybrid ARQ Protocols using Concatenated Codes in a DS–CDMA Rayleigh fading Channel", 4th Int'l. Conf. on Universal Personal Communications, Dec. 1995., pp. 748–752.

*Primary Examiner*—Stephen M. Baker
*Attorney, Agent, or Firm*—Russell B. Miller; Brian Edmonston; Sean English

[57] ABSTRACT

In a concatenated code data, correctly decoded code words from a block decoder is utilized to improve the performance of the convolutional decoder. A code word can sometimes be correctly decoded prior to receipt of all the symbols for the code word. Early decoding of the code word allows for the correct recreation of the entire code word, even the symbols which have not yet been received. The entire corrected code word is used by the convolutional decoder to eliminate branches the trellis, thus improving decoding of prior data bits and future data bits in the trellis. The chain back distance of the convolutional decoder can also be made shorter based on the knowledge that some of the received code words have been correctly decoded. Finally, the parity symbols which have not yet been received for the correctly decoded code word can be eliminated from transmission to improve the overall transmission rate.

35 Claims, 15 Drawing Sheets

|   | 1 | 2 | 3 | 4 | 5 | 6 | 7 | 8 | 9 | 10 | 11 | 12 | 13 | 14 |
|---|---|---|---|---|---|---|---|---|---|---|---|---|---|---|
|   |   |   |   |   | INFORMATION |   |   |   |   |   | PARITY |   |   |   |
| R.S. CODE WORD1 (n,k1) | a1 | a2 | a3 | a4 | a5 | a6 | a7 | a8 | a9 | pa1 | pa2 | pa3 | pa4 | pa5 |
| R.S. CODE WORD2 (n,k2) | b1 | b2 | b3 | b4 | b5 | b6 | b7 | b8 | pb1 | pb2 | pb3 | pb4 | pb5 | pb6 |
| R.S. CODE WORD3 (n,k3) | c1 | c2 | c3 | c4 | c5 | c6 | c7 | pc1 | pc2 | pc3 | pc4 | pc5 | pc6 | pc7 |
| R.S. CODE WORD4 (n,k4) | d1 | d2 | d3 | d4 | d5 | pd1 | pd2 | pd3 | pd4 | pd5 | pd6 | pd7 | pd8 | pd9 |
| R.S. CODE WORD5 (n,k5) | e1 | e2 | e3 | e4 | e5 | e6 | e7 | e8 | e9 | e10 | pe1 | pe2 | pe3 | pe4 |
| R.S. CODE WORD6 (n,k6) | f1 | f2 | f3 | f4 | f5 | f6 | f7 | f8 | pf1 | pf2 | pf3 | pf4 | pf5 | pf6 |

FIG. 4

METHOD AND APPARATUS FOR TRANSMITTING AND RECEIVING CONCATENATED CODE DATA

BACKGROUND OF THE INVENTION

I. Field of the Invention

The present invention relates to data communications. More particularly, the present invention relates to a novel and improved communication system employing concatenated coding.

II. Description of the Related Art

With the advent of digital communications and the need to transmit large amount of data through an impaired and bandlimited channel, the need for coding of digital data to facilitate correct data reception is of great significance. Data transmissions are typically hindered by impairments in the transmission channel, namely additive noise and spurious signals within the transmission bandwidth. The transmit power is limited by practical considerations and the transmitted signal is attenuated by the path loss and may be distorted by other phenomenon, such as multipath, before it reaches the receiver. The design of a digital communications system entails the determination of the worse case signal quality at which the receiver is expected to operate. This signal quality is measured as an energy-per-bit-to-noise ratio (Eb/No) and is determined by the transmitted power, path loss, and noise and interference. The minimum Eb/No which yields the desired level of performance is considered the system threshold level.

At the threshold level, the probability of error (PE) for any digital transmission scheme such as binary shift keying (BPSK), quaternary phase shift keying (QPSK), or quadrature amplitude modulation (QAM) can be calculated. Typically the PE of the selected transmission scheme is not adequate for the application. Improvement in the PE is achieved by encoding the digital data before transmission and decoding the data at the receiver. The coding scheme is determined by the requirements of the application and the channel characteristic. Coding allows for detection and correction of errors in the transmitted data at the expense of a lower effective data rate.

Two classes of coding, block coding and convolutional coding, are utilized to improve PE. Convolutional code provides good error correcting capability but typically outputs correlated bursts of error. Also, the Viterbi decoder supports the use of soft decisions to improve performance with minimal increase in hardware complexity. Block codes have built in burst error handling capability when combined with the proper level of interleaving. In fact, a single error correcting Reed-Solomon block code could handle any burst of errors within a single symbol. When convolutional coding alone would not produce the required coding gain, a concatenated code comprising a convolutional code and a block code can be used.

A Reed-Solomon code is a powerful non-binary, cyclic, and linear block code that achieves the largest possible code minimum distance ($d_{min}$) for any linear code with the same input (k) and output (n) block length. In this specification, lower case symbols are used to denote variables for the block code and upper case symbols are used to denote variables for the convolutional code. Reed-Solomon coding is well known in the art and a good treatment of the topic is found in a number of references, including "Error Control Coding: Fundamentals and Applications" by S. Lin and D. Costello", Prentice Hall, 1985, pgs. 171–176. In a non-binary code, m bits of data are combined to form a symbol. For an (n,k) Reed-Solomon code, blocks of k data symbols are encoded into blocks of n code symbols called Reed-Solomon code words. The (n,k) Reed-Solomon code is capable of correcting up to (n–k)/2 symbol errors within a block of n symbols. Since n code symbols are transmitted for k data symbols, the code rate, or reduction in the data rate, is k/n.

In a systematic block code, the k data symbols form the first k code symbols of the code word. The n–k parity symbols are formed by a linear combination of the k data symbols according to the generator polynomial g(x). Because of the linear, systematic, and cyclic properties of the Reed-Solomon code, the encoding process is easily achieved with simple shift registers and combinatory logic. The first step in the decoding process involves calculating a set of syndromes from the received n code symbols. The syndromes indicate the location and values of the symbol errors. In particular, the coefficients of the error location polynomial, σ(x), are calculated using the syndromes and from this, the error locators Xi and the error values Yi are computed. With the error locators and error values, the symbols in error are located and corrected.

A rate 1/N convolutional encoder encodes each input bit into N code bits called a code branch according to a set of N generator polynomials. Each generator polynomial G(x) computes one code bit. The N code bits are combined into an N-bit code branch. The constraint length K of the encoder is the number of data bits used in the encoding process and determines the error correcting capability of the code. Long constraint length K yields better performance at the expense of hardware and computational complexity. A state is designated by the K–1 prior input bits and there are $2^{K-1}$ possible states. For each of the $2^{K-1}$ states, a '0' or '1' input bit results in one of two possible code branches. Since each input bit is encoded into N code bits, the code rate for the convolutional encoder is 1/N. Other code rates could be obtained from a 1/N code by puncturing the code bits. Punctured codes are thoroughly treated by J. Cain, G. Clark, and J. Geist in "Punctured Convolutional Codes of Rate (n−1)/n and Simplified Maximum Likelihood Decoding," IEEE Transaction on Information Theory, IT-25, pgs. 97–100, January 1979.

A Viterbi algorithm is used to decode the transmitted code branches at the receiver. A discussion on the theory and operation of the Viterbi decoder is contained in the paper "Convolutional Codes and Their Performance in Communication Systems" by A. Viterbi, IEEE Transaction on Communication Technology, Vol. COM19, no. 5, October 1971, pgs. 821–835. Under certain assumptions about the channel noise, the Viterbi algorithm performs the maximum likelihood decoding of the transmitted data path. For each received code branch, the branch metric of all branches entering each state is computed and added to the corresponding prior path metrics. The best path entering each state is selected and stored as the new path metrics. The selected path is stored in a path memory. In "Development of Variable Rate Viterbi Decoder and its Performance Characteristics," Sixth International Conference on Digital Satellite Communications, Phoenix, Ariz., September 1983, Y. Yasuda et al. show that the survivor paths with the lowest path metric all converge to the same path after a certain chain back depth. Thus, a Viterbi decoded bit is obtained by tracing a path back by at least the chain back distance.

Interleavers and de-interleavers are utilized to combat channel characteristic and to maximize the code effectiveness. In a system in which the channel is not memoryless, bit errors at the receiver occur in bursts. The performance of the Viterbi decoder is better when the Viterbi decoder input contains non-burst type errors. Thus, a de-interleaver before the Viterbi decoder spreads the channel burst errors and 'whitens' the errors. Also, a Viterbi decoder has tendency to output bursts of correlated errors in the decoding process. Therefore, a de-interleaver after the Viterbi decoder spreads the burst errors from the Viterbi decoder over different Reed-Solomon code words. The depth of the de-interleaver determines the length of the burst errors which will be successfully handled by the system.

Typically, once a communication system has been designed, data are encoded and transmitted according to the concatenated code. All data bits are encoded and all code bits are transmitted.

SUMMARY OF THE INVENTION

The present invention is a novel and improved transmission scheme for concatenated coding with feedback. In accordance with the present invention, data are encoded and decoded using a concatenated code composed of a block code and a convolutional code. The encoded data is modulated, transmitted, received, and demodulated. When a portion of the received data is determined to be correct, it is utilized in the decoding of other portions of the received data to improve the overall performance.

It is an object of this invention to improve the performance of the Viterbi decoder by making use of Reed-Solomon code words that have been successfully decoded. The decoding of a Reed-Solomon code word can often be completed before the receipt of all of the parity symbols of that code word by the use of erasure filled decoding. A detail discussion of erasure filled decoding is provided below. In essence, each parity symbol which has not yet been received is filled with an erasure, preferably the all zero symbol 0, and the standard Reed-Solomon decoding algorithm is used to correct the errors and erasures. The symbols in the decoded Reed-Solomon code word are then used to eliminate paths in the decoding trellis used by the Viterbi decoder.

The Reed-Solomon code word which has been decoded early is used to generate all of the missing remaining parity symbols, which has not been received, for that code word. The generated parity symbols can be used by the Viterbi decoder to eliminate certain future branches from the trellis. Thus some of the future add/compare/select (ACS) operations of the Viterbi decoder are not required. The elimination of the ACS operations improves the reliability of the Viterbi decoder in decoding other future binary digits that are part of the symbols in other Reed-Solomon code words. Furthermore, the Reed-Solomon decoder may have corrected some of the previously received symbols furnished to it by the Viterbi decoder. This information can then be used to eliminate past branches from the trellis to improve the reliability of the Viterbi decoder in decoding other past binary digits that are part of the symbols in other Reed-Solomon code words.

It is another object of this invention to increase the effective transmitted data rate by eliminating transmission of unnecessary parity symbols from the Reed-Solomon encoder. Upon early decoding of a received Reed-Solomon code word, the receiver can transmit a signal to the transmitter acknowledging the correct reception of the code word and requesting the removal of future parity symbols for this code word from transmission. The transmitter can service this request by removing the parity symbols from further encoding or continue to convolutionally encode the parity symbols but withhold transmission of the code bits corresponding to those parity symbols. Alternately, the transmitter can be turned off for the time period corresponding to those parity symbols. The choice of action depends on the system requirements and the implementation complexity.

The foregoing, together with other objects, features and advantages of this invention, will become more apparent when referring to the following specification, claims and the accompanying drawings.

BRIEF DESCRIPTION OF THE DRAWINGS

The features, objects, and advantages of the present invention will become more apparent from the detailed description set forth below when taken in conjunction with the drawings in which like reference characters identify correspondingly throughout and wherein:

FIG. 4 is a diagram of the 1st interleaver after the variable rate Reed-Solomon encoder;

DETAILED DESCRIPTION OF THE PREFERRED EMBODIMENTS

Figure 1:
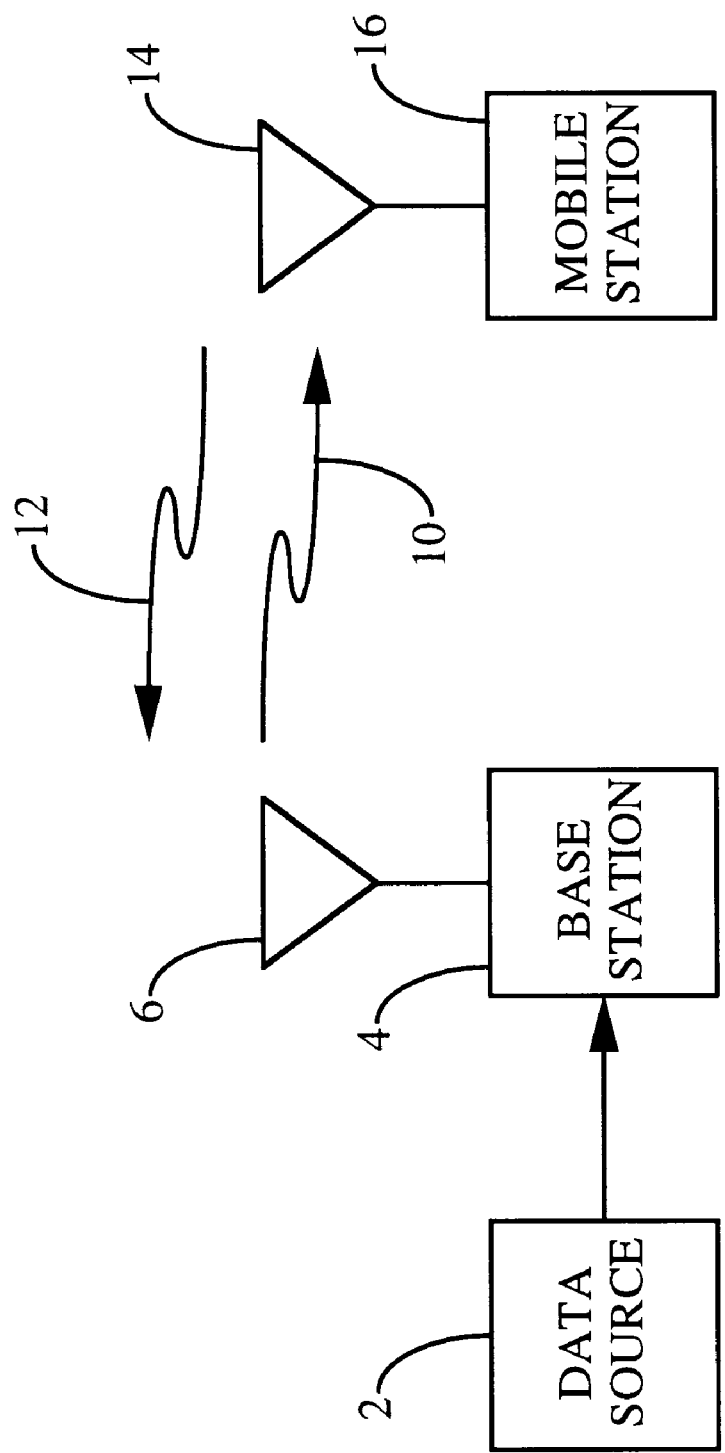
FIG. 1 is a block diagram of a digital transmission system.

A feature of Reed-Solomon codes that is to be utilized in this invention is that sometimes decoding can be completed even before all of the symbols corresponding to the code word have been received. The following discussion shows how such a situation can occur. Although the discussion makes use of a particular type of decoder, other decoders can be envisioned that would have the same behavior and are within the scope of the present invention. In the exemplary embodiment, the k symbols corresponding to the data are received first and the n–k symbols corresponding to the parity symbols are received last.

It is known in the art that a Reed-Solomon code with n–k parity symbols can correct t symbols in error and simultaneously fill in f erased (or missing) symbols provided that $(2t+f) \leq (n-k)$. Furthermore, to insure against incorrect decoding, a "safety factor" is placed in this inequality by insisting that $(2t+f) \leq (n-k-c)$ where c is a positive integer. The larger the value of c, the smaller the probability of incorrect decoding. In what follows, it will be assumed that c is chosen large enough to make the probability of incorrect decoding acceptable in view of system goals.

Now, assume that k information symbols plus c' parity symbols are received where c' is another positive integer that is related to c in a manner to be described later. The decoder can treat the remaining (n–k–c') parity symbols that have not yet been received as erasures and attempt to do erasure plus error decoding. Assume also that the decoding algorithm indicates that there are t errors in addition to the (n–k–c') erasures. The decoding can be terminated provided that (2t+n–k–c')≦(n–k–c). Canceling the term (n–k) on both sides of this equation gives the inequality (2t+c)≦c'. If this condition is satisfied for a value of c' strictly less than (n–k), then the decoding would be completed prior to receipt of all of the parity symbols of the code word. Specifically, assuming that t errors have occurred in transmission and that the decoder indicates the correct number of transmission errors, the decoding can stop when 2t+c parity symbols have been received.

As an example, assume that the safety factor is chosen as c=3 and that t errors have occurred in the code word. The decoding can be terminated after 2t+3 parity symbols are received. This number can be far fewer than the actual number of parity symbols in the code. For example, if no errors have occurred during transmission, decoding will be completed after only 3 of the n–k parity symbols have been received The performance of the Viterbi decoder can be improved by making use of the Reed-Solomon code words that have been successfully decoded. As indicated above, the decoding of a Reed-Solomon code word often can be completed before the receipt of all of the parity symbols of that code word. The symbols in the decoded Reed-Solomon code word are used to eliminate paths in the decoding trellis used by the Viterbi decoder. In particular, at every depth in the trellis, each of the $2^{K-1}$ states has two branches exiting from it, one branch corresponding to the binary digit taking the value 1 and the other branch corresponding to the binary digit taking the value 0. If the Reed-Solomon decoder has decided that this binary digit is equal to a 1, then all of the branches corresponding to that binary digit being equal to 0 can be eliminated from the trellis. Conversely, if the Reed-Solomon decoder has decided that this binary digit is equal to a 0, then all of the branches corresponding to that binary digit being equal to 1 can be eliminated from the trellis. Since this can occur before all of the parity symbols of the Reed-Solomon code word have been acted on by the Viterbi decoder, this information can be used by the Viterbi decoder to both modify its previous calculations and to simplify its future calculations. This can be viewed as having the Reed-Solomon decoder giving coarse corrections to the Viterbi decoder. The coarse corrections help to steer the Viterbi decoder toward the correct path in the trellis. Alternatively, the elimination of branches in the trellis could be viewed as "pruning the trellis".

Specifically, the steering of the Viterbi decoder can be done in two ways. If a Reed-Solomon code word is decoded early, all of the missing remaining (future) parity symbols for that code word are then known. Therefore, knowledge of the correct future parity symbols for the decoded code word can be used by the Viterbi decoder to prune future branches from the trellis. Some of the future add/compare/select operations of the Viterbi decoder are not required. Pruning future branches improves the reliability of the Viterbi decoder in decoding other future binary digits that are part of the symbols in other Reed-Solomon code words. Furthermore, the Reed-Solomon decoder may have corrected some of the previously received symbols furnished to it by the Viterbi decoder. Thus, knowledge of the correct prior symbols for the decoded code word can then be used to prune past branches from the trellis. Pruning past branches improves the reliability of the Viterbi decoder in decoding other past binary digits that are part of symbols in other Reed-Solomon code words.

FIG. 1 depicts a block diagram of a digital transmission system of the present invention. One such system is a Code Division Multiple Access (CDMA) communication system. In the exemplary embodiment, data source 2 contains a large amount of information, e.g. computer programs or the like, to be transmitted to mobile station 16. Data source 2 sends the data to base station 4. Base station 4 encodes the data and modulates the encoded data for transmission. In the exemplary embodiment, the modulation is performed in accordance with a CDMA modulation format as described in detail in U.S. Pat. No. 4,901,307 entitled "Spread Spectrum Multiple Access Communication System Using Satellite or Terrestrial Repeaters" and U.S. Pat. No. 5,103,459 entitled "System and Method for Generating Signal Waveforms in a CDMA Cellular Telephone System", both are assigned to the assignee of the present invention and included by reference. The modulated signal is transmitted by antenna 6 on forward channel 10. The transmitted signal is received by antenna 14 connected to mobile station 16. Mobile station 16 demodulates the signal and decodes the data. In the exemplary embodiment, the CDMA system is a full duplex communication system. Mobile station 16 can transmit data and requests to base station 4 over an independent reverse channel 12.

Figure 2:
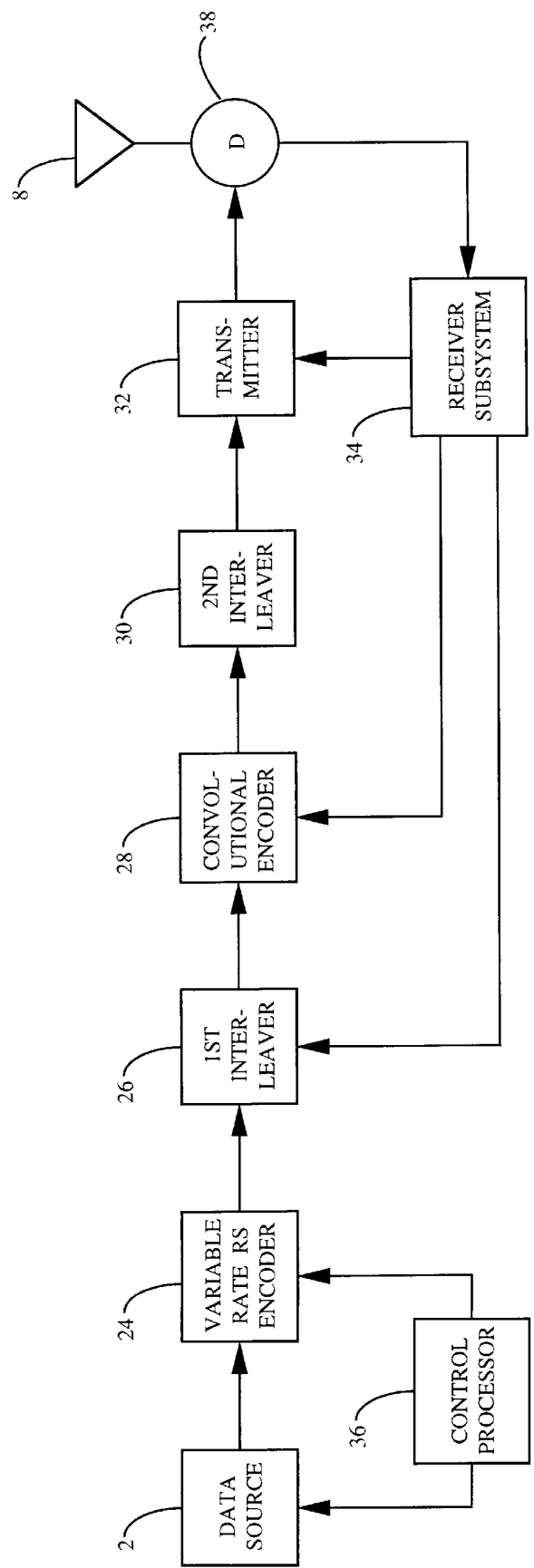
FIG. 2 is a block diagram of the encoder.

FIG. 2 illustrates a block diagram of the encoder system. Data source 2 sends the data to variable rate Reed-Solomon encoder 24 which encodes blocks of k data symbols into blocks of n code symbols. Since the Reed-Solomon code is systematic, the first k code symbols are the k data symbols and the remaining n–k code symbols are parity symbols. In the preferred embodiment, the k data symbols can be of varying predetermined lengths but the output code words are of fixed length n. The output code words from variable rate Reed-Solomon encoder 4 are provided to 1st interleaver 26. In the exemplary embodiment, 1st interleaver 26 is a block interleaver in which the symbols of the code words are stored in rows and read out in columns. 1st interleaver 26 reorders the code words, serializes the symbols into a bit stream, and sends the bit stream to convolutional encoder 28.

The design and implementation of convolutional encoders is known in the art. Convolutional encoder 28 encodes each input bit into N code bits. The code rate (1/N) and constraint length K are selected by the system design and do not impact the operation of the present invention. The output code bits from convolutional encoder 28 are provided to 2nd interleaver 30. 2nd interleaver 30 reorders the code bits and sends the bits to transmitter 32. Transmitter 32 performs filtering, modulation, amplification and upconversion. The signal from transmitter 32 is provided through duplexer 38 and transmitted by antenna 8.

Figure 3:
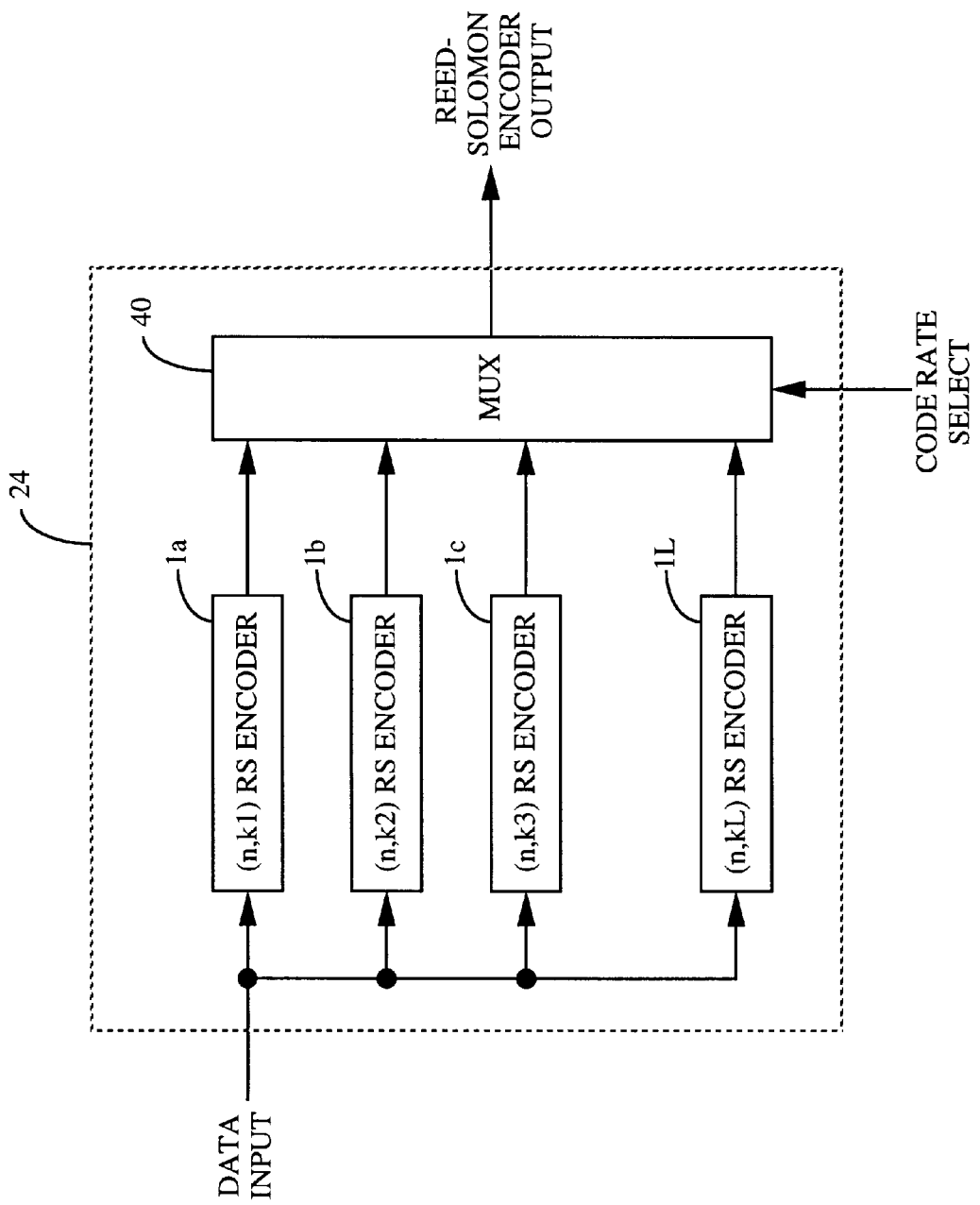
FIG. 3 is a block diagram of the variable rate Reed-Solomon encoder.

Variable rate Reed-Solomon encoder 24 is illustrated in FIG. 3. A bank of Reed-Solomon encoders 1a, 1b, 1c, through 1L encode the input data using different Reed-Solomon code rates. The desired Reed-Solomon encoder output is selected by controlling MUX 40. Referring back to FIG. 2, control processor 36 determines how the data is to be block coded, commands data source 2 to provide the required amount of data to variable rate Reed-Solomon encoder 24, and selects the output from the proper Reed-Solomon encoder 1 by controlling MUX 40. For example, control processor 36 could command Reed-Solomon encoder 1a to process the first block of k1 data symbols, Reed-Solomon encoder 1b to process the next block of k2 data symbols, and so on until 1st interleaver 26 is filled.

FIG. 4 shows the contents of 1st interleaver 26 after it has been filled. Code words from variable rate Reed-Solomon encoder 24 are written to 1st interleaver 26 by rows, with the data symbols written first and the parity symbols written last. In the preferred embodiment, consecutive code words are written into consecutive rows. After 1st interleaver 26 is filled, data are read out in columns with the data symbols read out first. In the exemplary 1st interleaver shown in FIG. 4, the order of symbols read from 1st interleaver is a1, b1, c1, etc. and the last symbols read out are pd9, pe4 and pf6.

Figure 5:
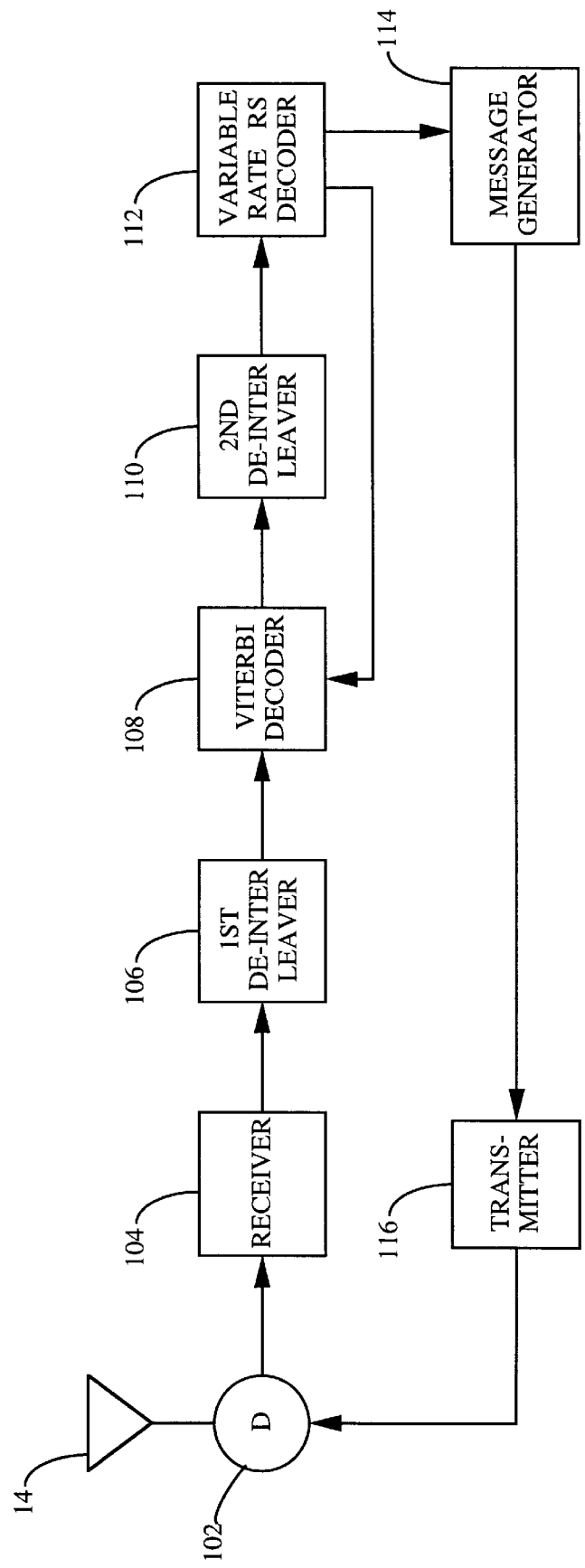
FIG. 5 is a block diagram of the decoder.

The block diagram of the decoder system within mobile station 16 is shown in FIG. 5. The transmitted signal is received by antenna 14 and routed through duplexer 102 to receiver 104. Receiver 104 downconverts, amplifies, demodulates, and filters the received signal. The digital data output from receiver 104 is sent to 1st de-interleaver 106. 1st de-interleaver 106 performs the inverse operation of 2nd interleaver 30. The size of 1st de-interleaver 106 could be made larger than that of 2nd interleaver 30 to accommodate soft decisions from receiver 104. 1st de-interleaver 106 provides data to Viterbi decoder 108.

Convolutional decoding is known in the art and any trellis decoder could perform decoding of convolutionally encoded data. In the preferred embodiment, a Viterbi decoder is utilized for convolutional decoding. The output from Viterbi decoder 108 is sent to 2nd de-interleaver 110. 2nd de-interleaver 110 performs the inverse operation of 1st interleaver 26, namely combining the data bits from Viterbi decoder 108 into code symbols, writing the symbols into 2nd de-interleaver 110 by column, and reading the symbols out by row. 2nd de-interleaver 110 sends code symbols to variable rate Reed-Solomon decoder 112. Variable rate Reed-Solomon decoder 112 starts decoding the received code words as soon as code symbols are received.

Figure 6:
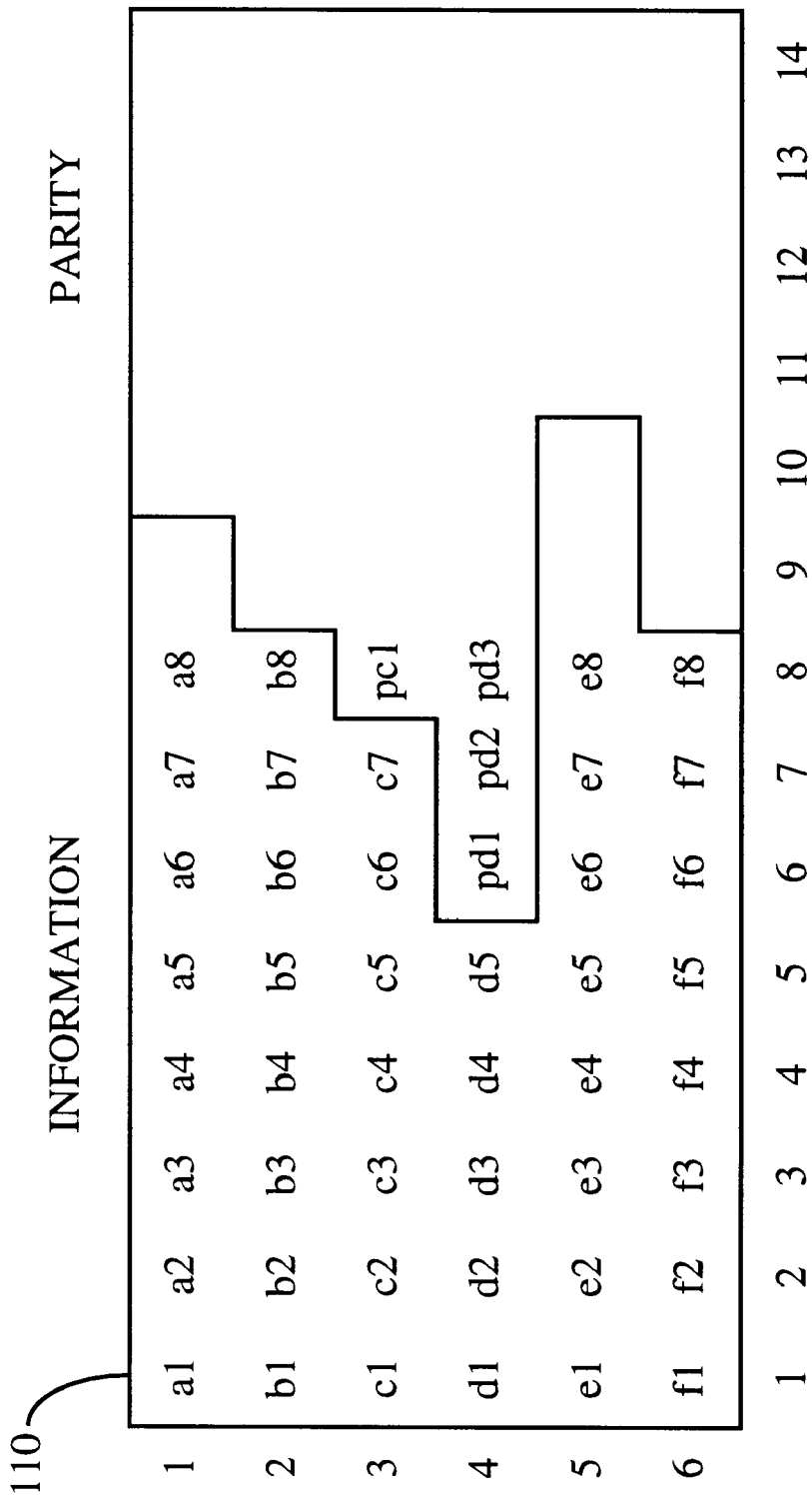
FIG. 6 is a diagram of the 2nd de-interleaver before the variable rate Reed-Solomon decoder.

An exemplary representation of a partially filled 2nd de-interleaver 110 is shown in FIG. 6. Data bits from Viterbi decoder 108 are combined into symbols and written into 2nd de-interleaver 110 by column. Therefore, row 1 column 1 receives the first received symbol a1, row 2 column 1 receives the second received symbol b1, and so on. Data from 2nd de-interleaver 110 is read out by rows. In the preferred embodiment, data is read from 2nd de-interleaver 110 as soon as a column is filled. Variable rate Reed-Solomon decoder 112 starts decoding as soon as the first code symbols is sent to it.

Figure 7:
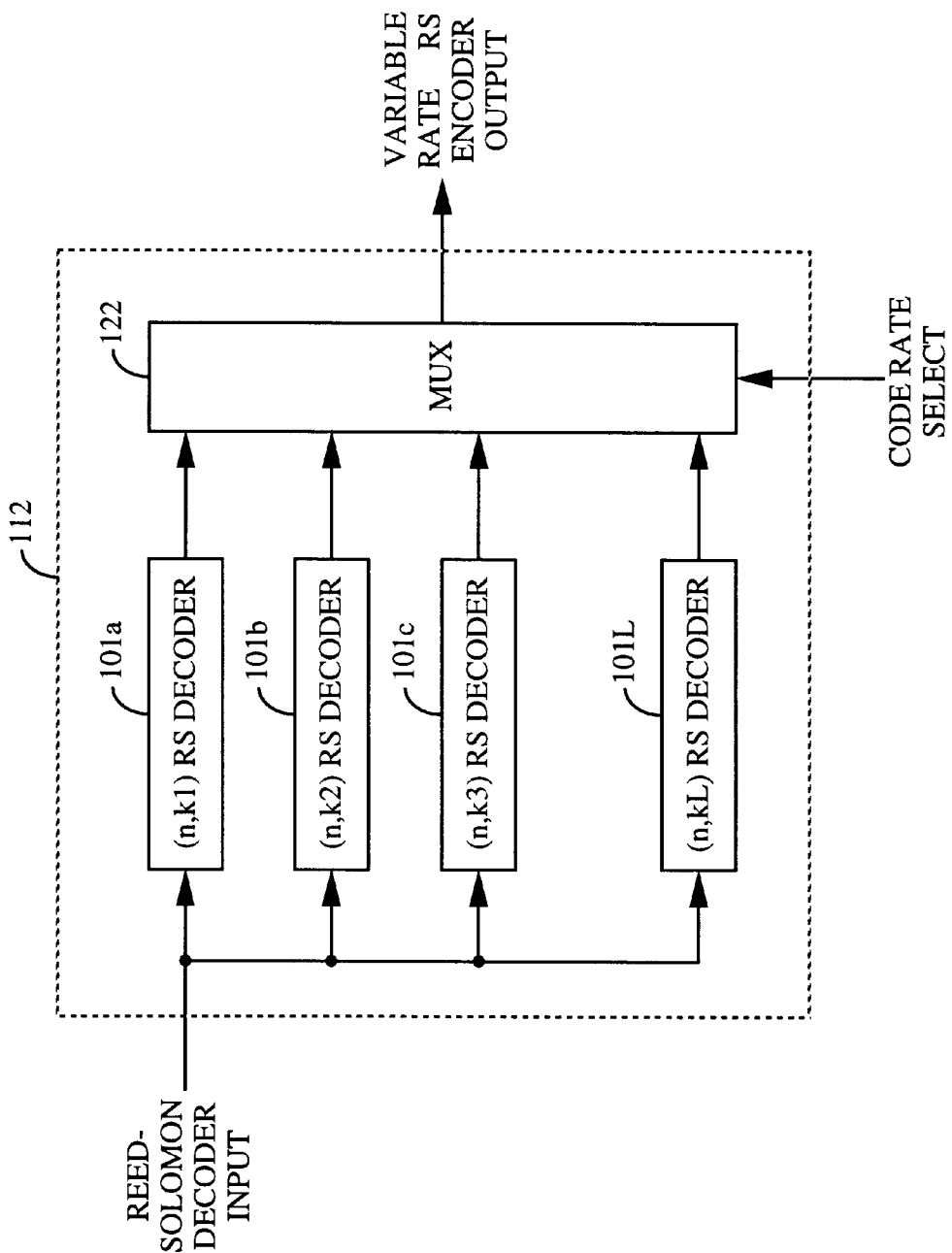
FIG. 7 is a block diagram of the variable rate Reed-Solomon decoder.

As illustrated in FIG. 7, variable rate Reed-Solomon decoder 112 contains a bank of Reed-Solomon decoders 101a, 101b, 101c, through 101L. Variable rate Reed-Solomon decoder 112 has apriori knowledge of the code rate (n,k) of each transmitted code word. The proper Reed-Solomon decoder 101 output is selected by controlling MUX 122.

Figure 8:
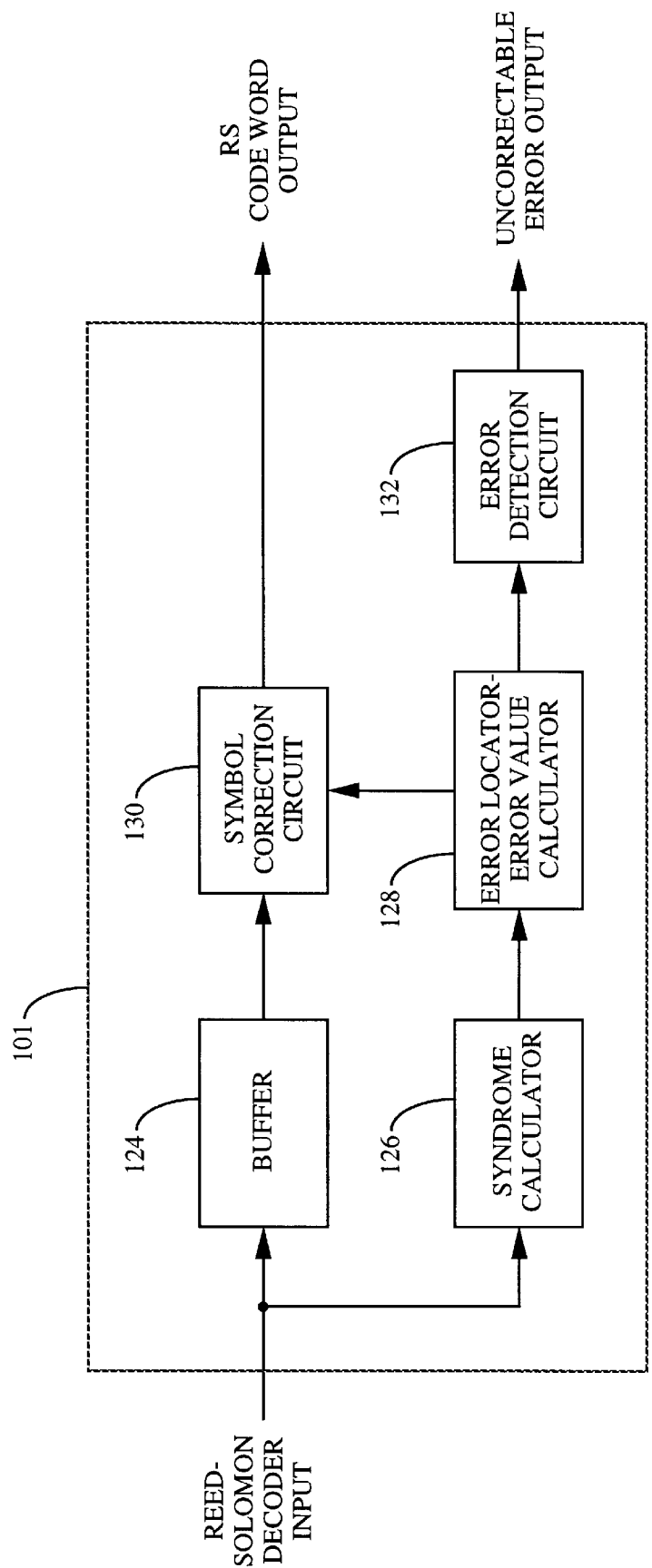
FIG. 8 is a block diagram of the Reed-Solomon decoder.

As shown in FIG. 8, each Reed-Solomon decoder 101 consists of buffer 124, syndrome calculator 126, error locator-error value calculator 128, symbol correction circuit 130, and error detection circuit 132. Received symbols are stored in buffer 124 and enter syndrome calculator 126. When all k information symbols and m (m=c, c+1, c+2, ..., n−k) parity symbols are received, the contents of the syndrome calculator is processed by error locator-error value calculator 128. As soon as no more than (m−c)/2 errors are indicated by error locator-error value calculator 128, the location and value of these errors as well as the values of the n−k−m parity symbols not yet received are passed to symbol correction circuit 130. Symbol correction circuit 130 then corrects whatever errors are determined to have occurred, fills in the missing parity symbols, and outputs the corrected code word. If all n−k parity symbols are received and the number of errors is thought to be greater than (n−k−c)/2, then error detection circuit 132 outputs a signal indicating an uncorrectable error.

In the first embodiment, upon determination that a code word has been correctly decoded, Reed-Solomon decoder 101 generates the remaining parity symbols for that code word. The parity symbols which have not yet been received can be generated by encoding the corrected data symbols of that code word with a Reed-Solomon encoder, as performed at base station 4. The generated parity symbols are provided to Viterbi decoder 108. Viterbi decoder 108 eliminates branches in the trellis corresponding to these generated parity symbols. Alternately, the branch metrics are weighted heavily in favor of the generated parity symbols and reflected in the path metrics. This forces the chain back path to traverse through these known good symbols. Thus, knowledge of a correctly decoded code word assists with the decoding of the other code words.

In the second embodiment, correctly decoded code words are also used by Viterbi decoder 108 to re-decode prior data. Re-decoding is performed by locating the known decoded symbols in path memory 228 of Viterbi decoder 108 and eliminating certain branches in the trellis. Alternately, Viterbi decoder 108 can replace the path metrics for the bits corresponding to these symbols by weighting heavily the branches corresponding to the decoded bits. This forces the chain back to traverse through these known good symbols.

In the third embodiment, variable rate Reed-Solomon decoder 112 notifies message generator 114 (see FIG. 5) of correctly decoded code words. Message generator 114 sends an acknowledgment to base station 4 and requests termination of transmission of the parity symbols for the correctly decoded code words. Message generator 114 sends the command to transmitter 116. Transmitter 116 modulates the command, amplifies the resultant signal, and routes the signal through duplexer 102 to antenna 14. Antenna 14 transmits the signal.

At the base station side shown in FIG. 2, the signal transmitted by mobile station 16 is received by antenna 8 and routed to receiver subsystem 34 through duplexer 38. Receiver subsystem 34 filters, amplifies, and demodulates the signal to retrieve the request from message generator 114. Receiver subsystem 34 services the request from message generator 114 in one of several ways. Receiver subsystem 34 could purge the untransmitted Reed-Solomon parity symbols for the correctly decoded code word from 1st interleaver 26, remove the convolutionally encoded code bits corresponding to the unnecessary parity symbols from convolutional encoder 28, or turn off transmitter 32 during the time period corresponding to transmission of the unnecessary parity symbols. It is envisioned that any combination of the foregoing steps may also be taken. Since the decoder within mobile station 16 can generate the parity symbols for the correctly decoded code words, transmission of these parity symbols would be redundant.

The theory and operation of Reed-Solomon coding is known in the art and described in the prior cited reference. The operation of the Reed-Solomon encoder and decoder is briefly described below to assist in the understanding and appreciation of the present invention.

Figure 9:
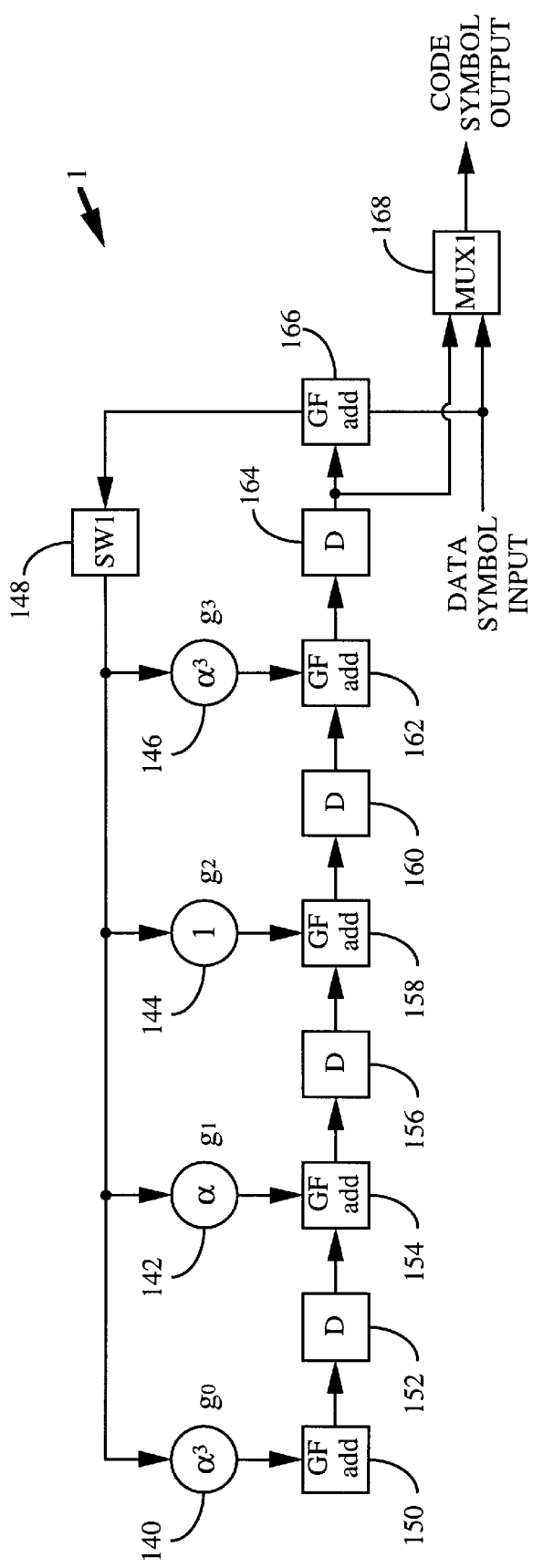
FIG. 9 is a diagram of a rate (7,3), $GF(2^3)$ Reed-Solomon encoder.

An exemplary Reed-Solomon encoder 1 is shown in FIG. 9 for a rate (7,3) code defined over $GF(2^3)$ where the data and code symbols are defined by the set $\{0, 1, \alpha, \alpha^2, \alpha^3, \alpha^4, \alpha^5, \alpha^6\}$ and the generator polynomial $g(x)=x^4+g_3x^3+g_2x^2+g_1x+g_0=x^4+\alpha^3x^3+\alpha x+\alpha^3$. Initially, the n–k registers 152, 156, 160, and 164 are reset to 0, switch SW1 148 is closed, and MUX1 168 is selected to allow data symbols to be routed to the output. After k data symbols have been shifted in, SW1 148 is opened and MUX1 168 is toggled to allow the n–k parity symbols to be read from registers 152, 156, 160, and 164. The coefficients of the generator polynomial g(x) are shown by GF multipliers 140, 142, 144, and 146. GF add 150, 154, 158, 162, and 166 are Galois field adders.

In the preferred embodiment, blocks of T symbols at a time are sent from 1st interleaver 26 to convolutional encoder 28. A length of time is required to encode, transmit, and decode the data, to acknowledge a correct code word detection, and to transmit, receive, and process the acknowledgment. It is probably not possible nor practical to react to the correct code word detection on a bit-by-bit basis or even a symbol-by-symbol basis. Too much overhead would be consumed for small incremental improvements. By processing a block of T symbols at a time, overhead is minimized while only a small amount of excess redundancy is transmitted.

The basic concept behind early decoding of Reed-Solomon codes is to treat the symbols that have not been received as "erasures" and then use the standard Reed-Solomon decoding algorithm for correcting the errors and erasures. In principle, any symbol within the Galois field could be substituted for each symbol that has not yet been received. In practice, the easiest method to perform erasure filled decoding is to substitute the all zero symbol for each erased symbol. After this substitution, the syndrome, error locator polynomial, error positions, and error and erasure values are calculated in the normal manner. The decoding of Reed-Solomon code words before all of the symbols have been received will be illustrated by a specific example as follows.

Consider a (7,3) Reed-Solomon code over GF(8). Let the code words be represented as the seven symbols $C_6$, $C_5$, $C_4$, $C_3$, $C_2$, $C_1$, $C_0$ or, alternately, by the polynomial $C(x)=C_6x^6+C_5x^5+C_4x^4+C_3x^3+C_2x^2+C_1x+C_0$. Let $\alpha$ be a primative element of GF(8). And, assume that the code words satisfy the four equations $C(\alpha)=0$, $C(\alpha^2)=0$, $C(\alpha^3)=0$, and $C(\alpha^4)=0$.

Now assume that the received symbols are $R_6$, $R_5$, $R_4$, $R_3$, $R_2$, $R_1$, $R_0$ which can also be represented by the polynomial $R(x)=R_6x^6+R_5x^5+R_4x^4+R_3x^3+R_2x^2+R_1x+R_0$. For this (7,3) Reed-Solomon code, the symbols $R_6$, $R_5$, $R_4$ are the three information symbols and the symbols $R_3$, $R_2$, $R_1$, $R_0$ are the four parity symbols. The syndromes for this received polynomial are:

$$S(\alpha^i)=R(\alpha^i) \text{ for } i=1, 2, 3, 4.$$

One method of computing these syndromes is by noting that:

$$S(\alpha^i)=R(\alpha^i)=R_6(\alpha^i)^6+R_5(\alpha^i)^5+R_4(\alpha^i)^4+R_3(\alpha^i)^3+R_2$$

$$(\alpha^i)^2+R_1(\alpha^i)+R_0=(((((R_6\alpha^i+R_5)\alpha^i+R_4)\alpha^i+R_3)\ \alpha^i+R_2)\alpha^i+R_1)\alpha R_0$$

Figure 10:
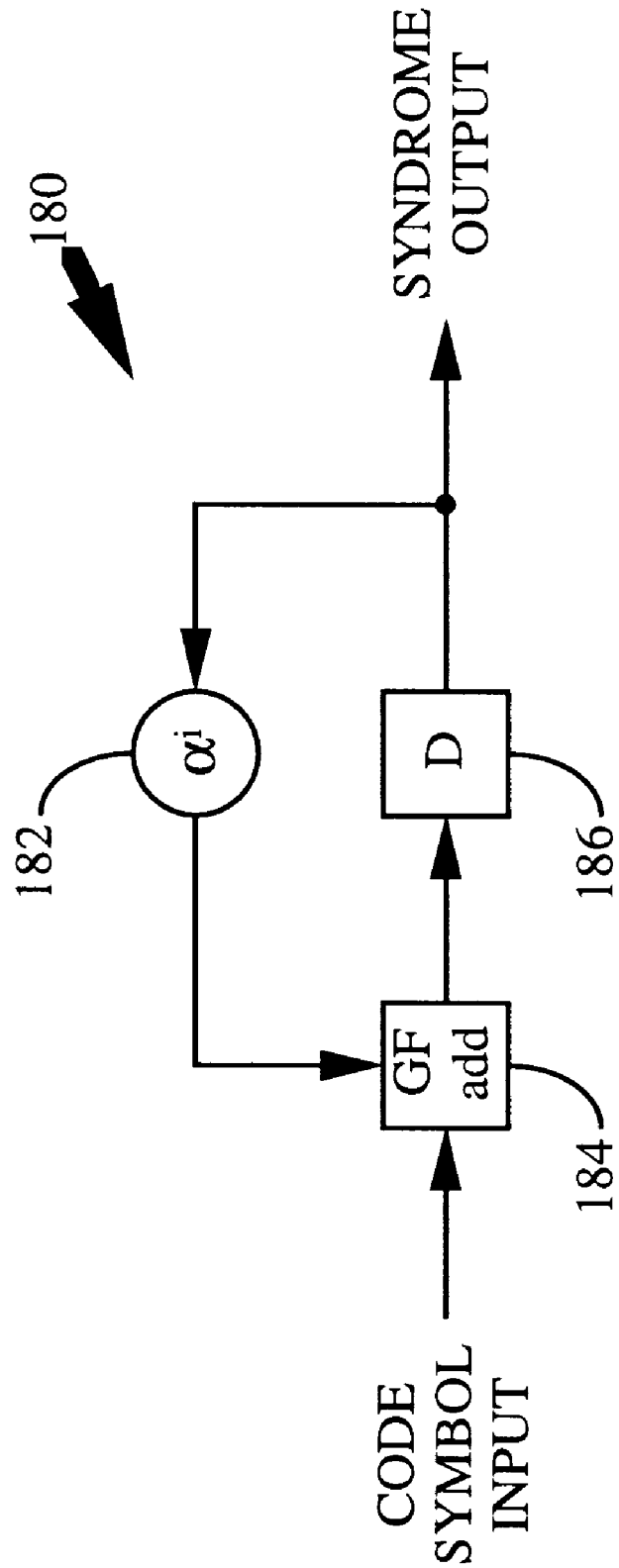
FIG. 10 is a diagram of a Reed-Solomon syndrome calculator.

This algebraic equation suggests that the circuit structure as shown in FIG. 10 could be used for computing $S(\alpha^i)$. One syndrome calculator 180 is needed for each of the four syndromes in this example. Within syndrome calculator 180, multiplier 182 is a Galois field multiplier which multiplies the input symbols by the field element $\alpha^i$, GF add 184 is a Galois field adder, and register 186 is a storage element that can store any element from GF(8). Initially, register 186 is reset to 0.

If all seven received symbols are available to Reed-Solomon decoder 101, the received symbols would be clocked into syndrome calculator 180 and the syndrome calculations would be performed in the following order. First, $R_6$ is clocked into syndrome calculator 180 after which time register 186 contains $R_6$. Next, $R_5$ is clocked into syndrome calculator 180 after which time register 186 contains $(R_6\alpha^i+R_5)$. Next, $R_4$ is clocked into syndrome calculator 180 after which time register 186 contains $((R_6\alpha^i+R_5)\alpha^i+R_4)$. Next, $R_3$ is clocked into syndrome calculator 180 after which time register 186 contains $(((R_6\alpha^i+R_5)\alpha^i+R_4)\alpha^i+R_3)$. Next, $R_2$ is clocked into syndrome calculator 180 after which time register 186 contains $((((R_6\alpha^i+R_5)\alpha^i+R_4)\alpha^i+R_3)\alpha^i+R_2)$. Next, $R_1$ is clocked into syndrome calculator 180 after which time register 186 contains $(((((R_6^i+R_5)\alpha^i+R_4)\alpha^i+R_3)\alpha^i+R_2)\alpha^i+R_1)$. Finally, $R_0$ is clocked into syndrome calculator 180 after which time register 186 contains $((((((R_6\alpha^i+R_5\alpha^i+R_4)\alpha^i+R_3)\alpha^i+R_2)\alpha^i+R_1)\alpha^i+R_0)$, which is the i-th syndrome, $S(\alpha^i)$.

Assume now that only four symbols $R_6$, $R_5$, $R_4$, $R_3$ have been received and the missing three symbols are considered as erasures. The most obvious solution would be to substitute 0 for the missing symbols such that $R_6$, $R_5$, $R_4$, $R_3$, 0, 0, 0 represent the code word to be decoded. This code word is passed to syndrome calculator 180 and the identical syndrome calculation procedure, as described above, is performed on the erasure filled code word. However, this solution has two disadvantages. First, syndrome calculator 180 would require seven clock cycles for the syndrome calculation even though only four symbols are being processed. Second, it is cumbersome to take the syndrome which was calculated with the four received symbols $R_6$, $R_5$, $R_4$, $R_3$ and modify it to obtain the syndrome which result from using five received symbols $R_6$, $R_5$, $R_4$, $R_3$, $R_2$. A much simpler approach would be to note that syndrome calculator 180, after processing the four received symbols $R_6$, $R_5$, $R_4$, $R_3$, contains the quantity $(((R_6\alpha^i+R_5)\alpha^i+R_4)\alpha^i+R_3)$. This quantity would be the appropriate syndrome if the received symbols are reordered as 0, 0, 0, $R_6$, $R_5$, $R_4$, $R_3$. Thus, this partial syndrome could be used as the true syndrome for the reordered code word 0, 0, 0, $R_6$, $R_5$, $R_4$, $R_3$. This partial syndrome could then be used with the standard Reed-Solomon decoding algorithm to find the error locations and error values, keeping in mind that the received symbols have been reordered within the code word. The advantage for using this method to compute partial syndromes is that when the next received symbol (in this case $R_2$) is received, it is entered into the same syndrome calculator 180 to get the syndrome for the reordered code word 0, 0, $R_6$, $R_5$, $R_4$, $R_3$, $R_2$. Thus, each additional received parity symbol can incrementally update the four syndromes for the code word to enable erasure filled decoding of the Reed-Solomon code word before all of the symbols for that code word have been received.

Convolutional coding is also known in the art and the theory and operation of convolutional encoding and Viterbi decoding can be appreciated by reference to any of the prior cited references. The implementation of the convolutional encoding and Viterbi decoding is briefly described below to facilitate appreciation of the present invention.

Figure 11:
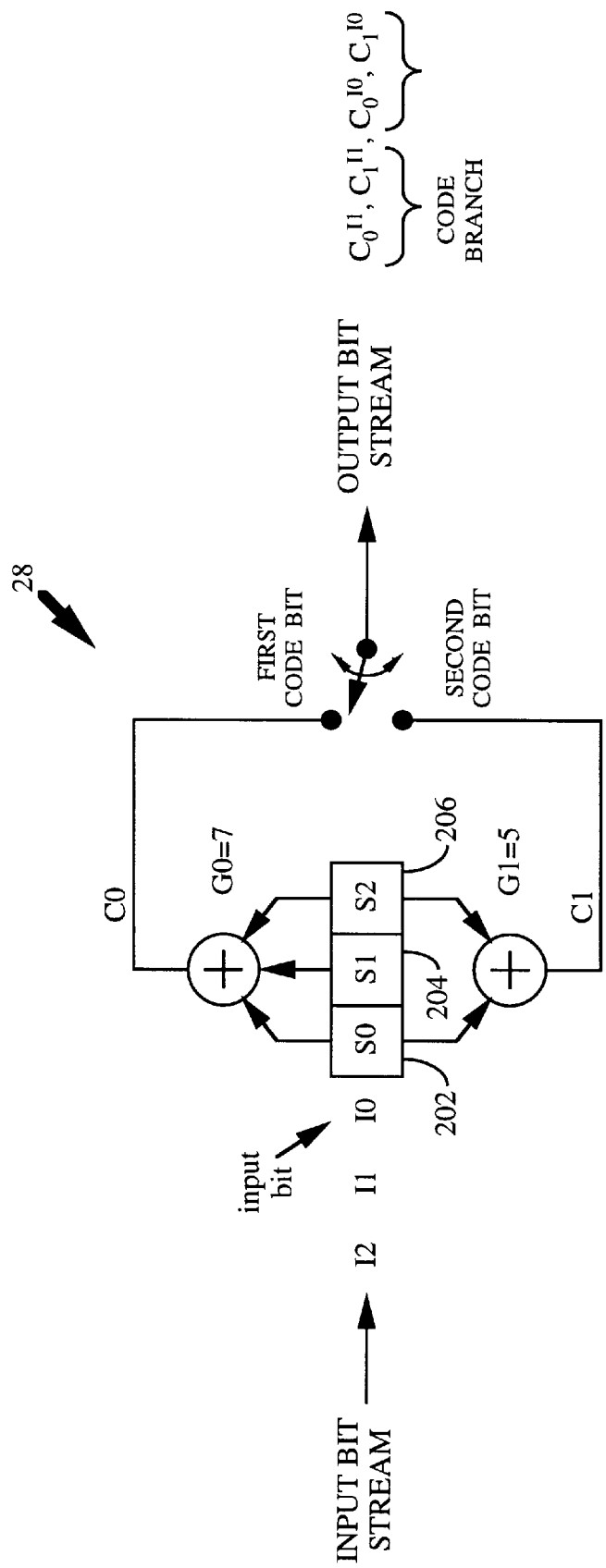
FIG. 11 is a diagram of a rate ½, K=3 convolutional encoder.

A exemplary rate ½, K=3 convolutional encoder 28 is shown in FIG. 11. The input data bits are encoded according to generator polynomial G(x) where G0=7 and G1=5. Each input bit results in two code bits C0 and C1. The code bit pair forms a code branch.

Figure 12:
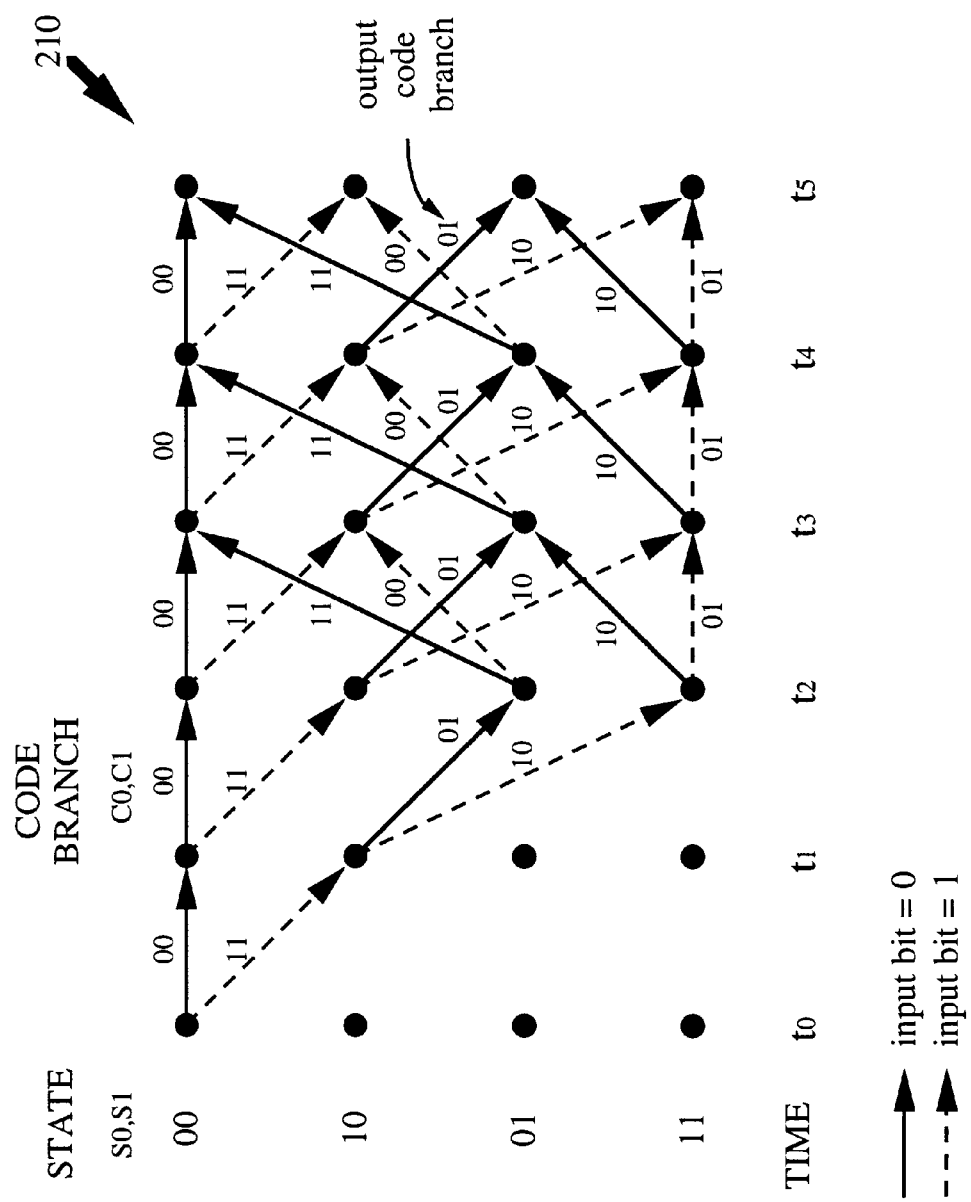
FIG. 12 is a trellis diagram of the rate ½, K=3 convolutional encoder.

FIG. 12 illustrates a trellis diagram for convolutional encoder 28. The $2^{K-1}$ states are designated by the K–1 left-most bits of the K-bit registers 202, 204, and 206 labeled $S_0$, $S_1$, and $S_2$, respectively, shown in FIG. 11. For each state, an input bit of '0' or '1' results in a new state and a corresponding output code branch.

Figure 13:
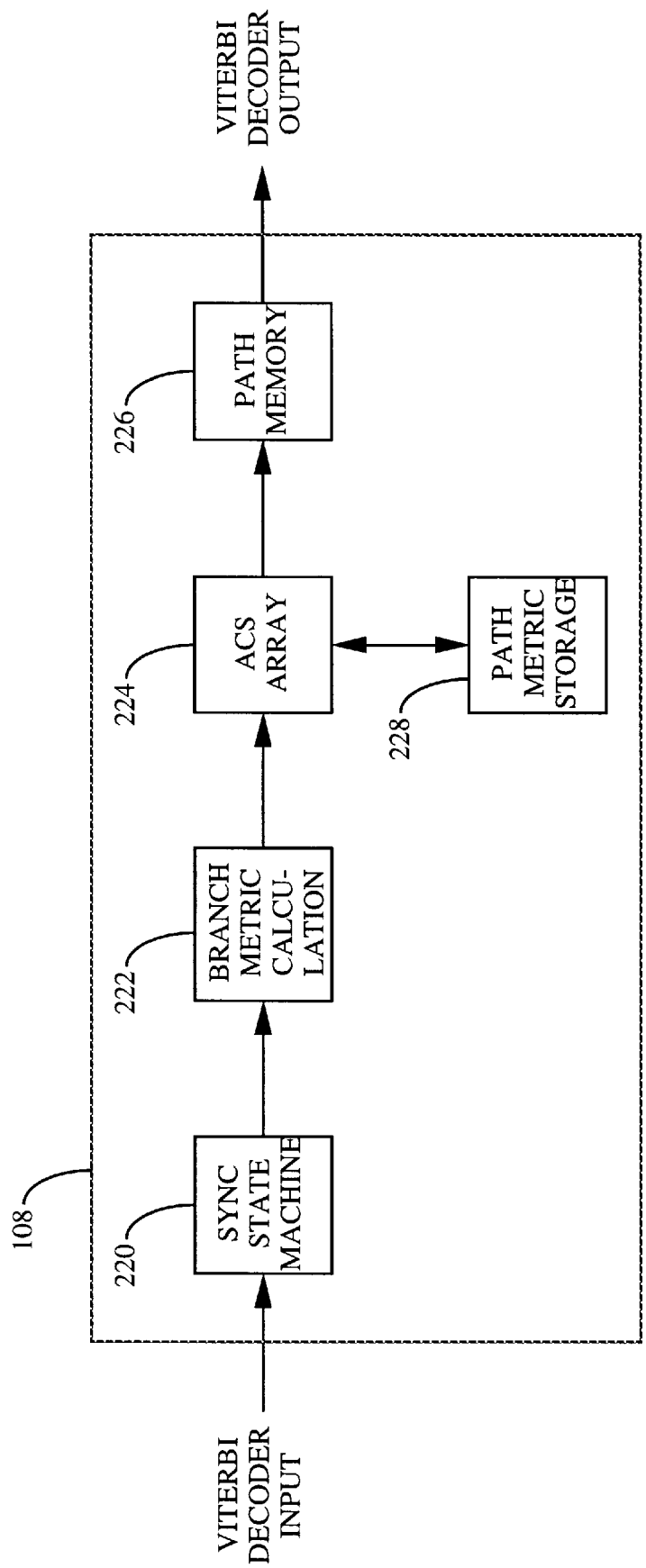
FIG. 13 is a block diagram of a Viterbi decoder.
Figure 14:
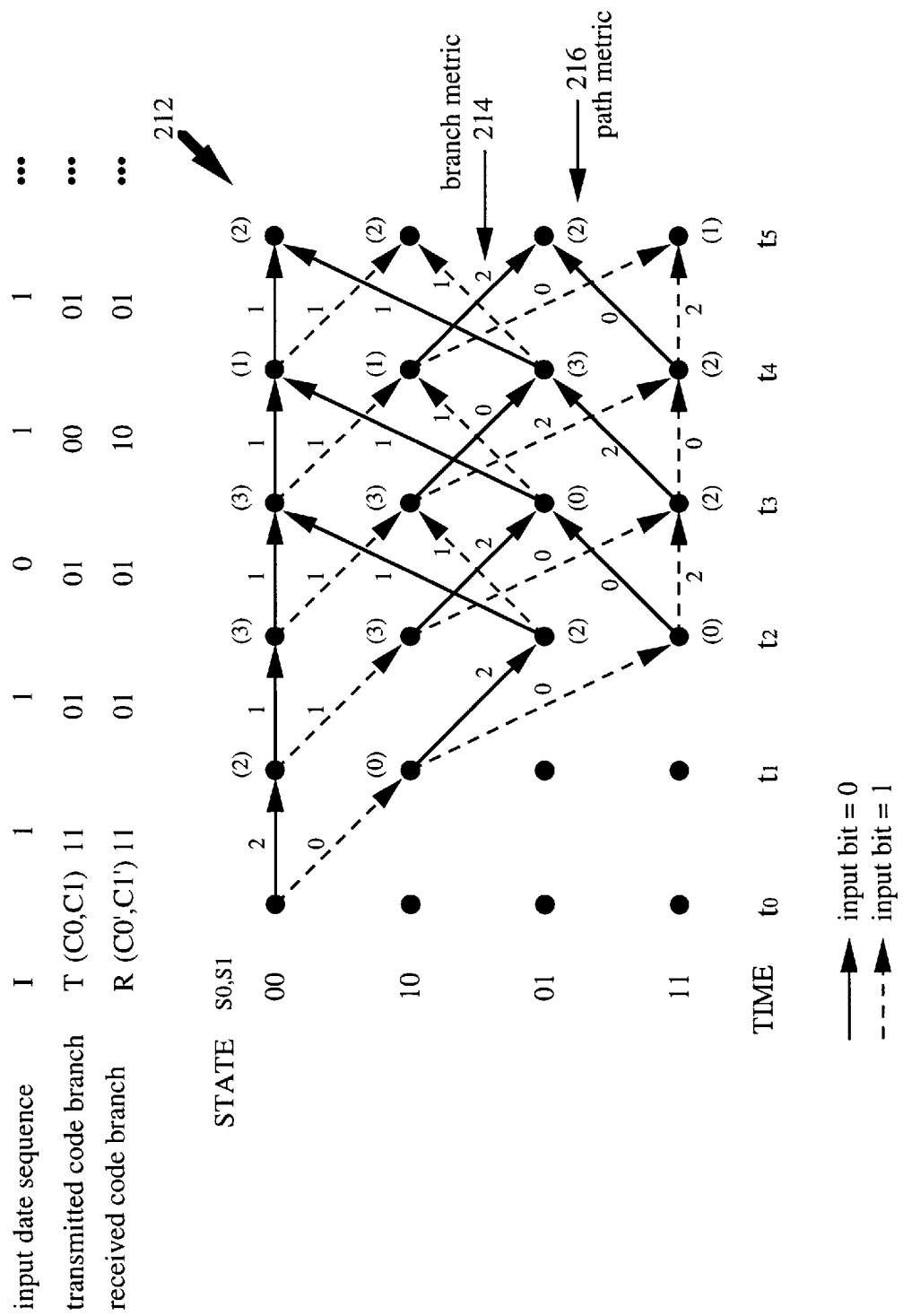
FIG. 14 is a trellis diagram of the rate ½, K=3 Viterbi decoder.

A block diagram of Viterbi decoder 108 is shown in FIG. 13 and the decoder trellis diagram 212 is shown in FIG. 14. Since each bit is encoded into an N-bit code branch, sync state machine 220 is needed to correctly group the incoming bits into code branches. For each code branch, branch metric calculation 222 computes branch metrics 214 between the received code branch and the branches of the two paths entering each state. For each state, ACS array 224 computes the path metrics 216 of the two paths entering that state by adding the old path metrics with the branch metrics 214. ACS array 224 then compares the path metrics of both paths entering that state and selects the path with the minimal path metric 216. The selected path for each state is stored in path memory 226 and the new path metric 216 is stored in path metric storage 228.

Figure 15:
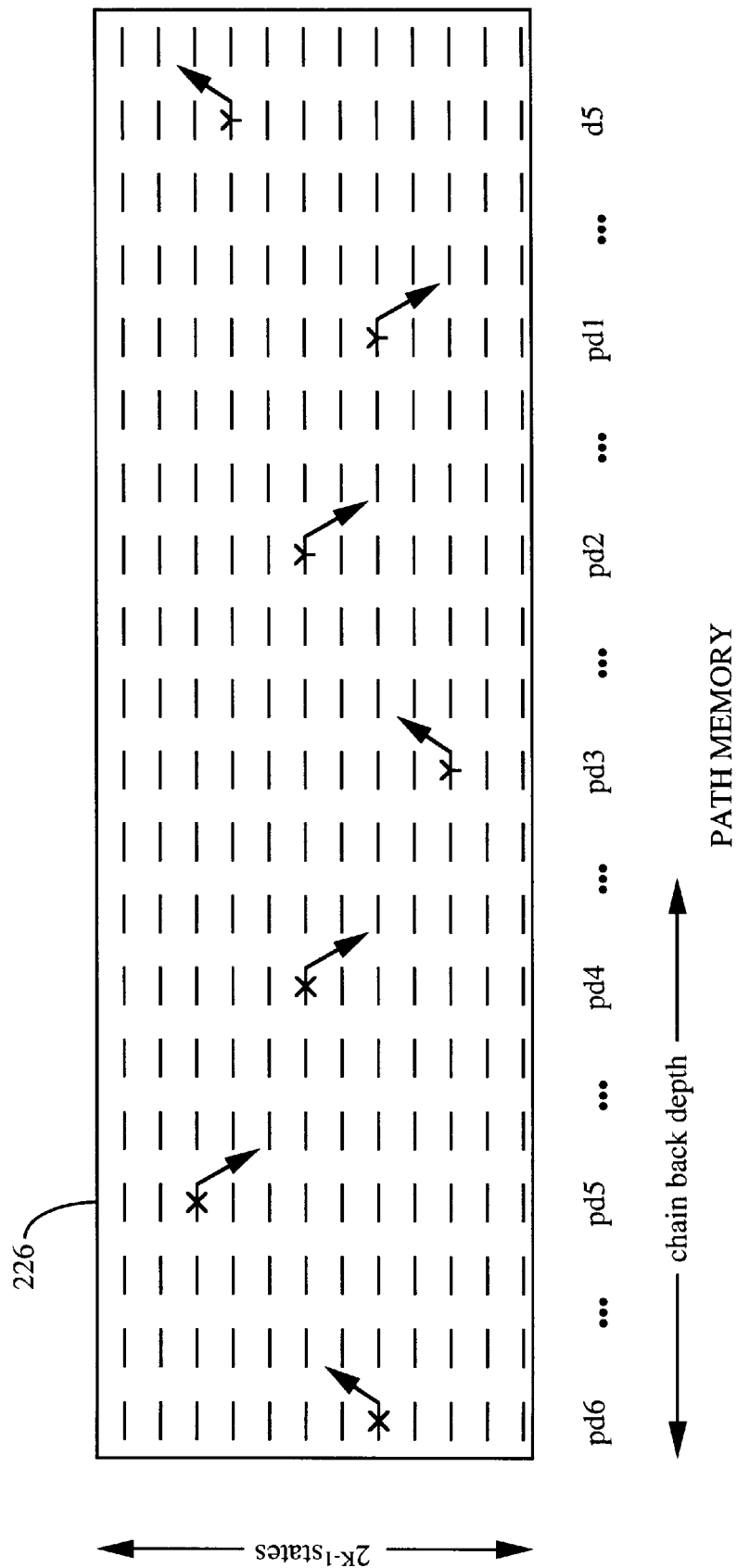
FIG. 15 is a diagram of the path memory of the Viterbi decoder.

FIG. 15 represents the Viterbi decoder path memory 226. A valid Viterbi decoder output is obtained by tracing a path back a chain back distance inside path memory 226. The path after the chain back distance is the sequence of the transmitted bits. In one embodiment of the invention, the chain back distance can be made shorter than that normally utilized since error detection is provided by the Reed-Solomon code.

Reed-Solomon decoding of code words commences as soon as the first parity symbol is received. For Reed-Solomon code words with short k, such as code word D shown in FIG. 6, the Reed-Solomon decoding process starts earlier. Upon detection of a correctly decoded code word, that code word is used by Viterbi decoder 108 to decode and re-decode other code words. For example, if code word D is declared correctly decoded after the receipt of the 3rd parity symbol pd3, Reed-Solomon encoder 124 can generate the subsequent parity symbols pd4, pd5, pd6, etc. and pass these generated parity symbols to Viterbi decoder 108. The generated parity symbols are shown by the X markings in path memory 226 in FIG. 15. Viterbi decoder 108 weighs these symbols heavily in the path metrics such that the chain back path always traverse through these known good symbols.

Likewise, Reed-Solomon encoder 124 can send symbols pd3, pd2, pd1, d5, etc., for the correctly decoded code word D to Viterbi decoder 108 for use in re-decoding. The known good symbols are illustrated by the Y markings in path memory 226 in FIG. 15. Again, Viterbi decoder 108 weighs these symbols heavily in the path metrics such that the chain back path always traverse through these known good symbols. 2nd de-interleaver 110 is updated with the re-decoded Viterbi decoder outputs.

The previous description of the preferred embodiments is provided to enable any person skilled in the art to make or use the present invention. The various modifications to these embodiments will be readily apparent to those skilled in the art, and the generic principles defined herein may be applied to other embodiments without the use of the inventive faculty. Thus, the present invention is not intended to be limited to the embodiments shown herein but is to be accorded the widest scope consistent with the principles and novel features disclosed herein.

I claim:

1. An apparatus for receiving concatenated code data comprising:

a first decoder for receiving a signal and decoding said signal in accordance with a first decoding format to provide decoded data; and a block decoder for receiving said decoded data, detecting an absence of errors in said decoded data, and providing a correction signal to said first decoder upon detection of an absence of errors;

wherein said first decoder is a trellis decoder that eliminates branches in a trellis and decodes a remaining portion of said signal in accordance with said correction signal; and wherein said trellis decoder has a chain back distance that is a function of said correction signal.

2. The apparatus of claim 1 wherein said trellis decoder is a Viterbi decoder.

3. The apparatus of claim 1 wherein said block decoder is a Reed-Solomon decoder.

4. The apparatus of claim 1 further comprising a de-interleaver means interposed between said first decoder and said block decoder for re-ordering symbols of said decoded data.

5. An apparatus for receiving concatenated code data from a remote station comprising:

a first decoder for receiving a signal sent from the remote station and decoding said signal in accordance with a first decoding format to provide a first decoded data;

a block decoder for receiving said first decoded data, detecting errors in said first decoded data, and providing a signal indicative of an absence of errors in said decoded data;

a transmitter for receiving said signal indicative of an absence of errors and for transmitting a control signal to said remote station in response to said signal indicative of an absence of errors; and a signal processing system for forming, in accordance with said signal indicative of an absence of errors, a purged parity bit signal at the remote station by omitting parity bit symbols associated with a correctly decoded code word from said signal sent to said first decoder, and for transmitting the purged parity bit signal to the first decoder.

6. The apparatus of claim 5, wherein said signal processing system purges untransmitted parity symbols from an interleaver.

7. The apparatus of claim 5, wherein said signal processing system removes convolutionally encoded code bits corresponding to the omitted parity symbols from a convolutional encoder.

8. The apparatus of claim 5, wherein said signal processor turns off a transmitter associated with the remote station during time periods corresponding to the omitted parity symbols.

9. A method for receiving concatenated code data comprising the steps of:

decoding, with a trellis decoder, a received signal in accordance with a first decoding format to provide decoded data;

block decoding said decoded data;

detecting an absence of errors in said decoded data;

providing a correction signal to said decoding step upon detection of an absence of errors; and eliminating branches in a trellis of the trellis decoder and decoding a remaining portion of said received signal in accordance with said correction signal; and wherein said trellis decoder has a chain back distance that is a function of said correction signal.

10. The method of claim 9 wherein said trellis decoder is a Viterbi decoder.

11. The method of claim 9 wherein said block decoding step is a Reed-Solomon decoding step.

12. The method of claim 9 further comprising a de-interleaving step interposed between said first decoding step and said block decoding step for reordering symbols of said first decoded data.

13. The method of claim 9, further comprising generating parity symbols by encoding a corrected data symbol upon said detecting of an absence of errors, and wherein said branches eliminated from the trellis correspond to the generated parity symbols.

14. A method for receiving concatenated code data from a remote station comprising:
   decoding a received signal sent from said remote station in accordance with a first decoding format to provide a first decoded data;
   block decoding said first decoded data;
   detecting errors in said first decoded data;
   providing a signal indicative of an absence of errors in said first decoded data;
   transmitting a control signal to said remote station in response to said signal indicative of an absence of errors; and
   forming, in accordance with said signal indicative of an absence of errors, a purged parity bit signal at the remote station by omitting parity bit symbols associated with a correctly decoded code word from said signal sent to said first decoder, and transmitting the purged parity bit signal.

15. The method of claim 14, wherein said forming step comprises purging untransmitted parity symbols from an interleaver.

16. The method of claim 14, wherein said forming step comprises removing convolutionally encoded code bits corresponding to the omitted parity symbols from a convolutional encoder.

17. The method of claim 14, wherein said forming step comprises turning off a transmitter associated with the remote station during time periods corresponding to the omitted parity symbols.

18. An apparatus for receiving concatenated code data comprising:
   a first decoder for receiving a signal and decoding said signal in accordance with a first decoding format to provide decoded data; and
   a variable rate Reed-Solomon decoder for receiving said decoded data, detecting an absence of errors in said decoded data, and providing a correction signal to said first decoder upon detection of an absence of errors;
   wherein said first decoder decodes a remaining portion of said signal in accordance with said correction signal; and
   wherein said trellis decoder has a chain back distance that is a function of said correction signal.

19. The apparatus of claim 18, wherein said first decoder is a trellis decoder.

20. The apparatus of claim 19, wherein said trellis decoder is a Viterbi decoder.

21. The apparatus of claim 18, further comprising a de-interleaver means interposed between said first decoder and said variable rate Reed-Solomon decoder for re-ordering symbols of said decoded data.

22. An apparatus for receiving concatenated code data comprising:
   a first decoder for receiving a signal and decoding said signal in accordance with a first decoding format to provide decoded data; and
   a block decoder for receiving said decoded data, detecting an absence of errors in said decoded data, and providing a correction signal to said first decoder upon detection of an absence of errors;
   wherein said first decoder is a trellis decoder that weights branch metrics and decodes a remaining portion of said signal in accordance with said correction signal; and
   said trellis decoder has a chain back distance that is a function of said correction signal.

23. The apparatus of claim 22, wherein said trellis decoder is a Viterbi decoder.

24. The apparatus of claim 22, further comprising a de-interleaver means interposed between said first decoder and said block decoder for re-ordering symbols of said decoded data.

25. The apparatus of claim 22, wherein the block decoder generates parity symbols by encoding a corrected data symbol upon said detection of an absence of errors, and wherein said first decoder weights said branch metrics in favor of the generated parity symbols.

26. A method for receiving concatenated code data comprising the steps of:
   first decoding a received signal in accordance with a first decoding format to provide decoded data;
   block decoding, with a variable rate Reed-Solomon decoder, said decoded data;
   detecting an absence of errors in said decoded data;
   providing a correction signal to said first decoding step upon detection of an absence of errors;
   decoding a remaining portion of said received signal in accordance with said correction signal;
   generating parity symbols by encoding a corrected data symbol upon said detecting of an absence of errors, and wherein said branches eliminated from the trellis correspond to the generated parity symbols.

27. The method of claim 26, wherein said first decoding step is a trellis decoding step.

28. The method of claim 27, wherein said trellis decoding step is a Viterbi decoding step.

29. The method of claim 26, wherein said trellis decoding step has a chain back distance that is a function of said correction signal.

30. The method of claim 26, further comprising a de-interleaving step interposed between said first decoding step and said block decoding step for re-ordering symbols of said decoded data.

31. A method for receiving concatenated code data comprising the steps of:
   decoding, with a trellis decoder, a received signal in accordance with a first decoding format to provide decoded data;
   block decoding said decoded data wherein said block decoding step is a variable rate Reed-Solomon decoding using variable rate Reed Solomon decoding;
   detecting an absence of errors in said decoded data;
   providing a correction signal to said decoding step upon detection of an absence of errors; and
   weighting branch metrics of the trellis decoder and decoding a remaining portion of said received signal in accordance with said correction signal.

32. The method of claim 31 wherein said trellis decoder is a Viterbi decoder.

33. The method of claim 31, further comprising a de-interleaving step interposed between said step of decoding with a trellis decoder and said block decoding step for reordering symbols of said decoded data.

34. A method for receiving concatenated code data comprising the steps of:

decoding, with a trellis decoder, a received signal in accordance with a first decoding format to provide decoded data;

block decoding said decoded data;

detecting an absence of errors in said decoded data;

providing a correction signal to said decoding step upon detection of an absence of errors; and weighting branch metrics of the trellis decoder and decoding a remaining portion of said received signal in accordance with said correction signal; and wherein said trellis decoder has a chain back distance that is a function of said correction signal.

35. A method for receiving concatenated code data comprising the steps of:

decoding, with a trellis decoder, a received signal in accordance with a first decoding format to provide decoded data;

block decoding said decoded data;

detecting an absence of errors in said decoded data;

providing a correction signal to said decoding step upon detection of an absence of errors; and weighting branch metrics of the trellis decoder and decoding a remaining portion of said received signal in accordance with said correction signal; and further comprising generating parity symbols by encoding a corrected data symbol upon said detecting of an absence of errors, and wherein said trellis decoder weights said branch metrics in favor of the generated parity symbols.

* * * * *